(12) United States Patent
Nishibe et al.

(10) Patent No.: US 11,906,246 B2
(45) Date of Patent: Feb. 20, 2024

(54) ORGANIC FILM FORMING APPARATUS

(71) Applicant: SHIBAURA MECHATRONICS CORPORATION, Yokohama (JP)

(72) Inventors: Yukinobu Nishibe, Yokohama (JP); Akinori Iso, Yokohama (JP); Keigo Oomori, Yokohama (JP); Takashi Takahashi, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 791 days.

(21) Appl. No.: 16/899,767

(22) Filed: Jun. 12, 2020

(65) Prior Publication Data

US 2020/0310183 A1 Oct. 1, 2020

Related U.S. Application Data

(63) Continuation of application No. PCT/JP2018/045879, filed on Dec. 13, 2018.

(30) Foreign Application Priority Data

Dec. 15, 2017 (JP) ................................. 2017-240763
Sep. 28, 2018 (JP) ................................. 2018-185545

(51) Int. Cl.
*F27B 17/00* (2006.01)
*F27D 7/06* (2006.01)
(Continued)

(52) U.S. Cl.
CPC .............. *F27B 17/00* (2013.01); *C23C 14/56* (2013.01); *F26B 3/30* (2013.01); *F26B 9/06* (2013.01);
(Continued)

(58) Field of Classification Search
CPC ........................................................ F27B 5/00
See application file for complete search history.

(56) References Cited

U.S. PATENT DOCUMENTS

| 5,756,650 A | 5/1998 | Kawamonzen et al. |
| 2006/0185590 A1 | 8/2006 | Schaepkens et al. |

(Continued)

FOREIGN PATENT DOCUMENTS

| JP | S62-80199 U | 5/1987 |
| JP | H01-154515 A | 6/1989 |

(Continued)

OTHER PUBLICATIONS

JP-2001118852-A English translation (Year: 2001).*

(Continued)

*Primary Examiner* — Steven S Anderson, II
*Assistant Examiner* — Kurt J Wolford
(74) *Attorney, Agent, or Firm* — PEARNE & GORDON LLP

(57) ABSTRACT

According to one embodiment, an organic film forming apparatus includes a chamber configured to maintain an atmosphere more reduced than an atmospheric pressure, at least one processing room provided inside the chamber and being surrounded by a cover, and an exhaust part configured to exhaust the inside the chamber. The processing room includes an upper heating part including first heaters, a lower heating part including second heaters, and facing the upper heating part, an upper heat equalizing plate provided on the lower heating part side of the upper heating part, a lower heat equalizing plate provided on the upper heating part side of the lower heating part, and workpiece supporters configured to support a workpiece through a gap between the upper and lower heat equalizing plates.

13 Claims, 6 Drawing Sheets

(51) Int. Cl.
- *F27B 5/04* (2006.01)
- *F27B 5/14* (2006.01)
- *F26B 3/30* (2006.01)
- *F26B 9/06* (2006.01)
- *C23C 14/56* (2006.01)

(52) U.S. Cl.
CPC .............. *F27B 5/04* (2013.01); *F27B 5/14* (2013.01); *F27D 7/06* (2013.01)

(56) References Cited

U.S. PATENT DOCUMENTS

| | | | |
|---|---|---|---|
| 2006/0185591 A1 | 8/2006 | Muralidharan et al. | |
| 2013/0216969 A1* | 8/2013 | Schwartz | F27B 17/0016 432/238 |
| 2015/0136026 A1 | 5/2015 | Yang et al. | |

FOREIGN PATENT DOCUMENTS

| | | |
|---|---|---|
| JP | H10-321546 A | 12/1998 |
| JP | 2001-118852 A | 4/2001 |
| JP | 2001118852 A * | 4/2001 |
| JP | 2002-195755 A | 7/2002 |
| JP | 2004-115813 A | 4/2004 |
| JP | 2015-520514 A | 7/2015 |
| JP | 2016-223733 A | 12/2016 |
| JP | 2016223733 A * | 12/2016 |
| JP | 2017-083140 A | 5/2017 |
| JP | 2017083140 A * | 5/2017 ............ H01L 21/02 |
| JP | 2017-166802 A | 9/2017 |
| KR | 10-0687378 B1 | 2/2007 |
| KR | 10-2007-0103465 A | 10/2007 |
| KR | 10-2014-0000725 A | 1/2014 |
| WO | 99/49501 A2 | 9/1999 |
| WO | 2006/091405 A2 | 8/2006 |

OTHER PUBLICATIONS

JP-2017083140-A English translation (Year: 2017).*
JP-2016223733-A English translation (Year: 2016).*
SPC Surface Treatment Experts, Plating on Copper Base Materials (Year: 2017).*
Monarch Metal Inc. MFPROJ-438 (Year: 2007).*

* cited by examiner

ORGANIC FILM FORMING APPARATUS

CROSS-REFERENCE TO RELATED APPLICATIONS

This is a continuation application of International Application PCT/JP2018/045879, filed on Dec. 13, 2018. This application is also based upon and claims the benefit of priority from Japanese Patent Application No. 2017-240763, filed on Dec. 15, 2017; No. 2018-185545, filed on Sep. 28, 2018; the entire contents of which are incorporated herein by reference.

FIELD

Embodiments described herein relate generally to an organic film forming apparatus.

BACKGROUND

There is a technique that forms an organic film forming apparatus on a substrate by coating solution including an organic material and solvent on the substrate and heating the substrate. For example, in manufacturing a liquid crystal display panel, a varnish including polyamic acid is coated on a surface of a transparent electrode etc. provided on a transparent substrate, a polyimide film is formed by imidizing, and the obtained film is subjected to rubbing treatment to form an orientation film. At this time, the substrate coated with the varnish including polyamic acid is heated to imidize polyamic acid (for example, JP 2004-115813 A (Kokai)). It is also performed that the substrate coated with the solution including the organic material and the solvent is heated to evaporate the solvent, and the organic film is formed on the substrate.

When the solution including the organic material and the solvent is coated on the substrate and the organic film is formed by heating the substrate, high temperature processing of about 100° C. to 600° C. may be necessary.

In such a case, when heat radiated toward the substrate is released outside the processing room for the heating, heat storage efficiency deteriorates. When the heat storage efficiency deteriorates, in order to supplement the heat released outside the processing room, it is needed to heat at a temperature higher than the temperature necessary for the processing, and power applied to a heating part increases. When rapid temperature rise is needed, the desired temperature rise may not be realized.

The development of heating technique with low heat loss and high heat storage efficiency has been desired.

SUMMARY

According to one embodiment, an organic film forming apparatus includes a chamber configured to maintain an atmosphere more reduced than an atmospheric pressure, at least one processing room provided inside the chamber and being surrounded by a cover, and an exhaust part configured to exhaust the inside the chamber. The processing room includes an upper heating part including a plurality of first heaters provided to be arranged in a predetermined direction, the plurality of first heaters having a rod shape, a lower heating part including a plurality of second heaters provided to be arranged in a predetermined direction, facing the upper heating part, and the plurality of second heaters having a rod shape, an upper heat equalizing plate provided on the lower heating part side of the upper heating part, gap being provided between an upper surface of the upper heat equalizing plate and the lower surfaces of the first heaters, a lower heat equalizing plate provided on the upper heating part side of the lower heating part, gap being provided between an lower surface of the lower heat equalizing plate and the upper surfaces of the second heaters, and a plurality of workpiece supporters configured to support a workpiece through a gap between the upper heat equalizing plate and the lower heat equalizing plate. The workpiece includes a substrate and a solution including polyamic acid coated on an upper surface of the substrate. The workpiece supporters are rod-shaped bodies. The processing room has a space communicating with the chamber. The exhaust part reduces a pressure inside the chamber, and reduces a pressure of a space between an inner wall of the chamber and the cover.

DETAILED DESCRIPTION

Figure 1:
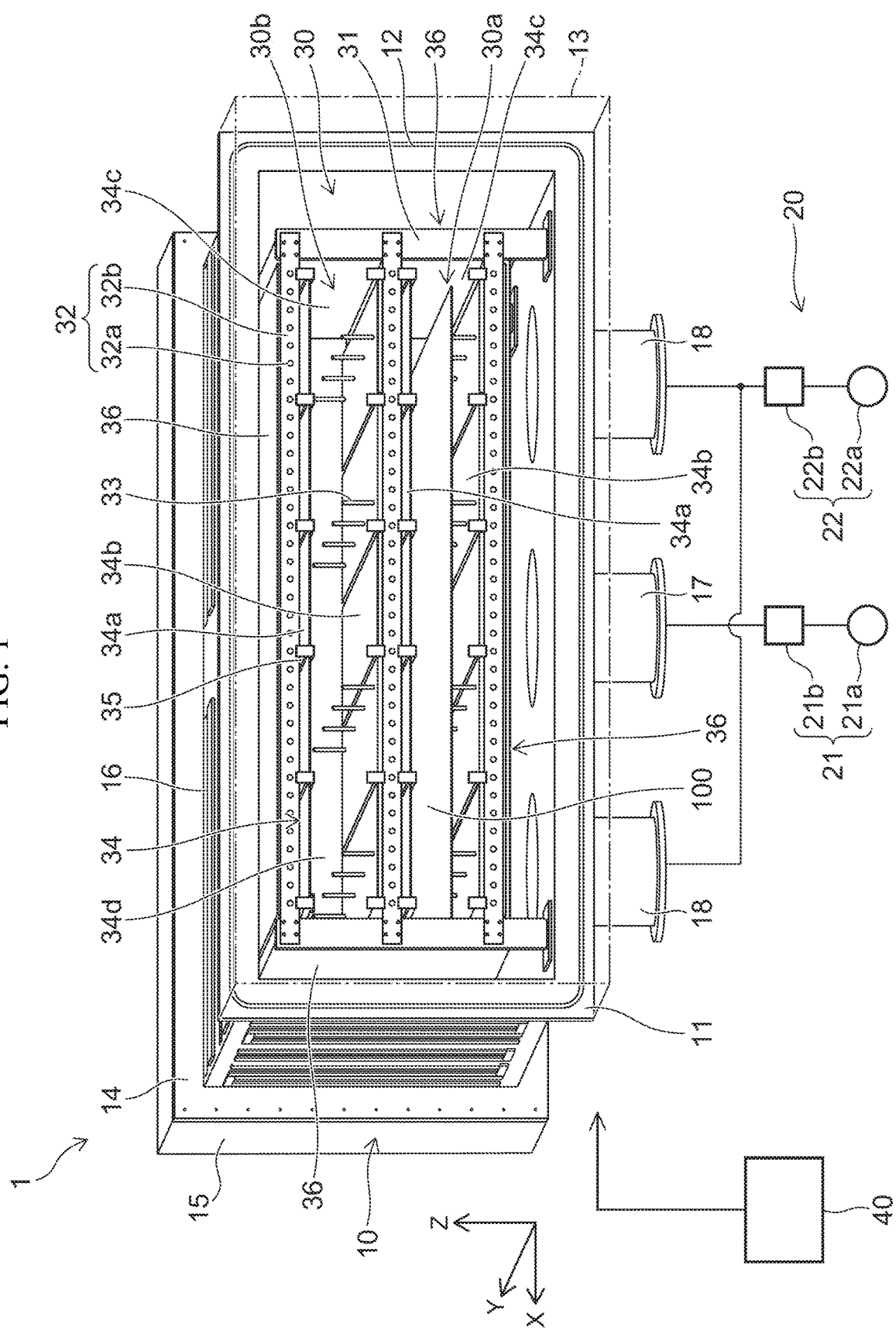
FIG. 1 is a schematic perspective view for illustrating an organic film forming apparatus according to the embodiment.

Various embodiments are described below with reference to the accompanying drawings.

In the specification and drawings, components similar to those described previously or illustrated in an antecedent drawing are marked with like reference numerals, and a detailed description is omitted as appropriate.

FIG. 1 is a schematic perspective view for illustrating an organic film forming apparatus 1 according to the embodiment.

An X-direction, a Y-direction, and a Z-direction in FIG. 1 indicate three directions which are orthogonal one another.

A vertical direction in the specification can be the Z-direction.

Figure 5:
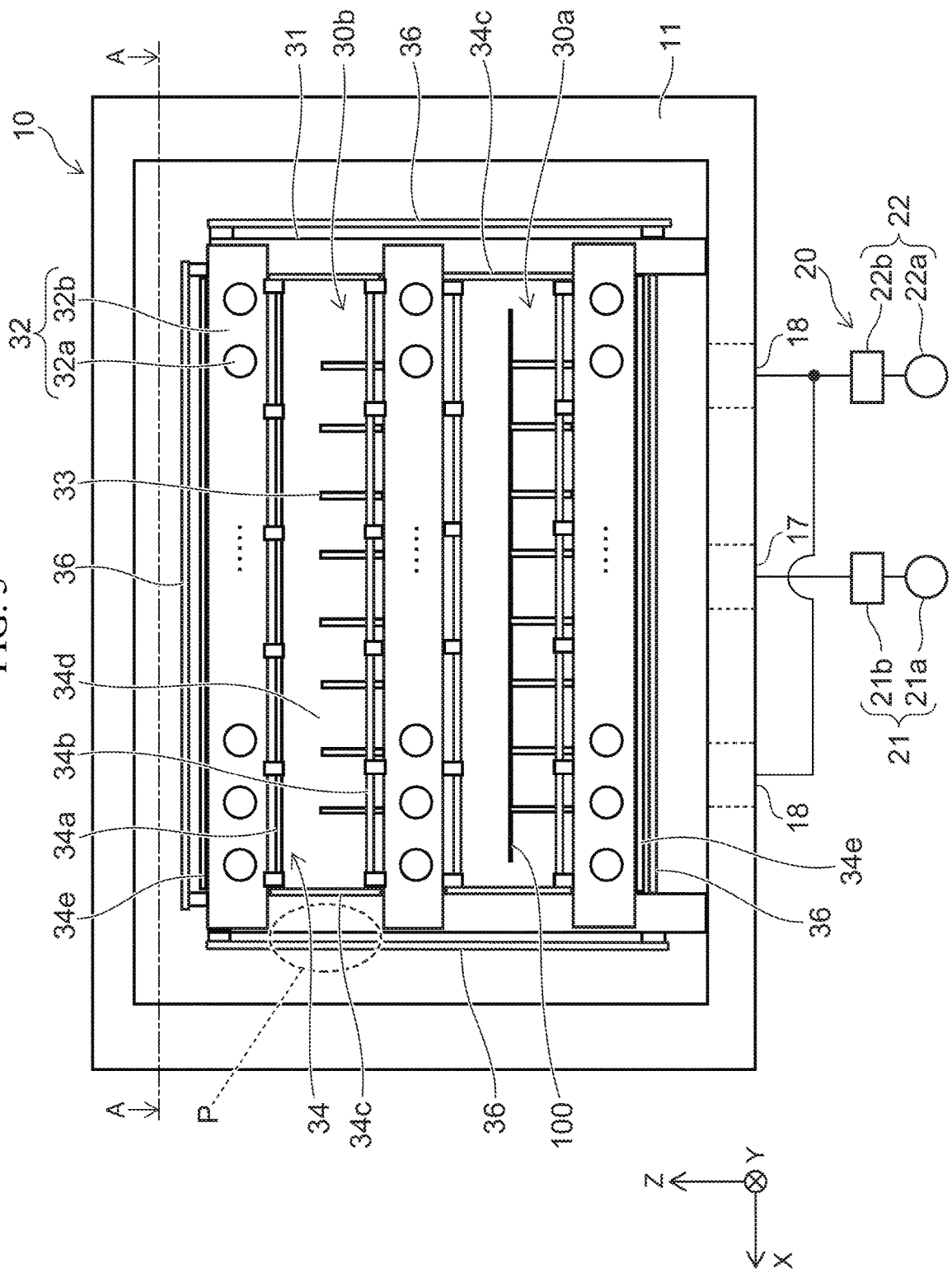
FIG. 5 is a schematic view for illustrating a specific example of the organic film forming apparatus according to the embodiment.

As shown in FIG. 1 and FIG. 5, the organic film forming apparatus 1 is provided with a chamber 10, an exhaust part 20, a processing part 30, and a controller 40.

The chamber 10 has a box shape. The chamber 10 has an airtight structure capable of maintaining an atmosphere reduced in pressure from the atmospheric pressure. The appearance shape of the chamber 10 is not particularly limited. The appearance shape of the chamber 10 can be, for example, a rectangular parallelepiped. The chamber 10 can be formed of a metal such as stainless steel, for example.

A flange 11 can be provided at one end of the chamber 10. A seal material 12 such as an O-ring can be provided on the flange 11. The opening of the chamber 10 on the side where the flange 11 is provided can be opened and closed by a door 13. When the door 13 is pressed against the flange 11 (seal material 12) by a drive device not shown, the opening of the chamber 10 is closed so as to be airtight. The drive device not shown separates the opening/closing door 13 from the flange 11, so that the workpiece 100 can be loaded or unloaded through the opening of the chamber 10.

A flange 14 can be provided at the other end of the chamber 10. The seal material 12 such as an O-ring can be provided on the flange 14. The opening of the chamber 10 on the side where the flange 14 is provided can be opened and closed by a lid 15. For example, the lid 15 can be detachably provided on the flange 14 using a fastening member such as a screw. When performing maintenance or the like, the lid 15 is removed to expose the opening of the chamber 10 on the side where the flange 14 is provided.

A cooling part 16 can be provided on the outer wall of the chamber 10. A cooling water supply part not shown is connected to the cooling part 16. The cooling part 16 can be, for example, a water jacket. If the cooling part 16 is provided, it is possible to suppress the temperature of the outer wall of the chamber 10 from becoming higher than a predetermined temperature.

The exhaust part 20 exhausts the inside of the chamber 10. The exhaust part 20 includes a first exhaust part 21 and a second exhaust part 22.

The first exhaust part 21 is connected to the exhaust port 17 provided on the bottom of the chamber 10. The first exhaust part 21 includes an exhaust pump 21a and a pressure controller 21b.

The exhaust pump 21a can be, for example, a dry vacuum pump or the like.

The pressure controller 21b is provided between the exhaust port 17 and the exhaust pump 21a.

The pressure controller 21b controls the internal pressure of the chamber 10 to a predetermined pressure based on the output of a vacuum gauge or the like not shown that detects the internal pressure of the chamber 10.

The pressure controller 21b can be, for example, an APC (Auto Pressure Controller).

The second exhaust part 22 is connected to an exhaust port 18 provided on the bottom surface of the chamber 10. The second exhaust part 22 includes an exhaust pump 22a and a pressure controller 22b.

The exhaust pump 22a can be, for example, a turbo molecular pump (TMP). The second exhaust part 22 has an exhaust capability capable of exhausting to a high-vacuum molecular flow region.

The pressure controller 22b is provided between the exhaust port 18 and the exhaust pump 22a.

The pressure controller 22b controls the internal pressure of the chamber 10 to be a predetermined pressure based on the output of a vacuum gauge not shown that detects the internal pressure of the chamber 10.

The pressure controller 22b can be, for example, an APC.

When reducing the pressure inside the chamber 10, first, the internal pressure of the chamber 10 is adjusted to about 10 Pa by the first exhaust part 21. Next, the internal pressure of the chamber 10 is adjusted to about 10 Pa to $1 \times 10^{-2}$ Pa by the second exhaust part 22. In this way, the time required to reduce the pressure to a desired pressure can be shortened.

As described above, the first exhaust part 21 is an exhaust pump that performs rough exhaust from atmospheric pressure to a predetermined internal pressure. Therefore, the first exhaust part 21 has a large exhaust amount. The second exhaust part 22 is an exhaust pump that exhausts gas to a lower predetermined internal pressure after the rough exhaust is completed. After at least the first exhaust part 21 starts exhausting, power can be applied to a heating part 32 described later to start heating.

An exhaust port 17 connected to the first exhaust part 21 and an exhaust port 18 connected to the second exhaust part 22 are arranged on the bottom surface of the chamber 10. Thereby, a down flow airflow toward the bottom surface of the chamber 10 can be formed in the chamber 10 and the processing part 30. As a result, the sublimate including the organic material, which is generated by heating the workpiece 100 to which the solution including the organic material and the solvent is coated, is easily discharged out of the chamber 10 along the down flow airflow.

Thus, the organic film can be formed without the sublimate re-adhering to the workpiece 100.

In addition, if the exhaust port 17 connected to the first exhaust part 21 having a large exhaust amount is disposed at the center of the bottom surface of the chamber 10, the exhaust port 17 faces the center of the chamber 10 when the chamber 10 is viewed in a plan view. A uniform air flow can be formed. Thus, the sublimate can be discharged without causing the sublimate to stay due to the uneven flow of the airflow. Therefore, the organic film can be formed without the sublimate re-adhering to the workpiece 100.

Here, when a solution including an organic material and a solvent is applied on a substrate and heated to form an organic film, a processing at an extremely high temperature of about 100° C. to 600° C. may be required.

In such a case, if the heat radiated toward the substrate is released to the outside of the processing room for heating, the heat storage efficiency deteriorates. When the heat storage efficiency is deteriorated, it becomes necessary to perform heating at a temperature higher than the temperature required for processing in order to supplement the heat released to the outside of the processing room, and the power applied to the heating part increases. In the case of a process requiring a rapid temperature rise, a desired temperature rise may not be realized.

Therefore, in the organic film forming apparatus 1 according to the embodiment, the processing part 30 (the processing rooms 30a and 30b) is provided inside the chamber 10. As described later, the processing rooms 30a and 30b are surrounded by a cover 36. A space is provided between the inner wall of the chamber 10 and the cover 36. That is, the organic film forming apparatus 1 according to the embodiment has a double structure including the chamber 10 and the processing part 30 (processing rooms 30a and 30b).

The space in the processing part 30 (the processing rooms 30a and 30b) is a space that communicates with the space in the chamber 10. Therefore, when heating the workpiece 100 in the processing part 30, the pressure in the space between the inner wall of the chamber 10 and the cover 36 as well as the space in the processing rooms 30a and 30b is reduced. Therefore, if the processing part 30 is provided inside the chamber 10, heat released from the processing part 30 to the outside can be suppressed. As a result, there is no need to perform additional heating to compensate for the released heat, so that the power applied to the heating part 32 can be reduced. In addition, since the temperature of the heater 32a (corresponding to an example of the first to third heaters) can be prevented from becoming higher than a predetermined temperature, the life of the heater 32a can be extended.

Further, since the heat storage efficiency is improved, it is possible to obtain a desired temperature rise even in a process that requires a rapid temperature rise. Further, since the temperature of the outer wall of the chamber 10 can be suppressed from increasing, the cooling part 16 can be simplified.

That is, according to the organic film forming apparatus 1 according to the embodiment, the substrate coated with the solution including the organic material and the solvent is heated with low heat loss and high heat storage efficiency, and the organic film can be formed.

Further, since a down flow airflow is formed inside the chamber 10, the vapor including the organic material generated when the workpiece 100 coated with the solution including the organic material and the solvent is heated, rides the air flow toward the bottom of the chamber 10. Therefore, it is possible to suppress the vapor including the organic material from diffusing and adhering to the inside of the chamber 10, so that maintenance (cleaning) is facilitated.

The workpiece 100 includes the substrate and the solution coated on the upper surface of the substrate.

The substrate can be, for example, a glass substrate or a semiconductor wafer. However, the substrate is not limited to the illustrated one.

The solution includes organic materials and solvents. The organic material is not particularly limited as long as it can be dissolved by a solvent. The solution can be, for example, a varnish including polyamic acid. However, the solution is not limited to those exemplified.

Figure 6:
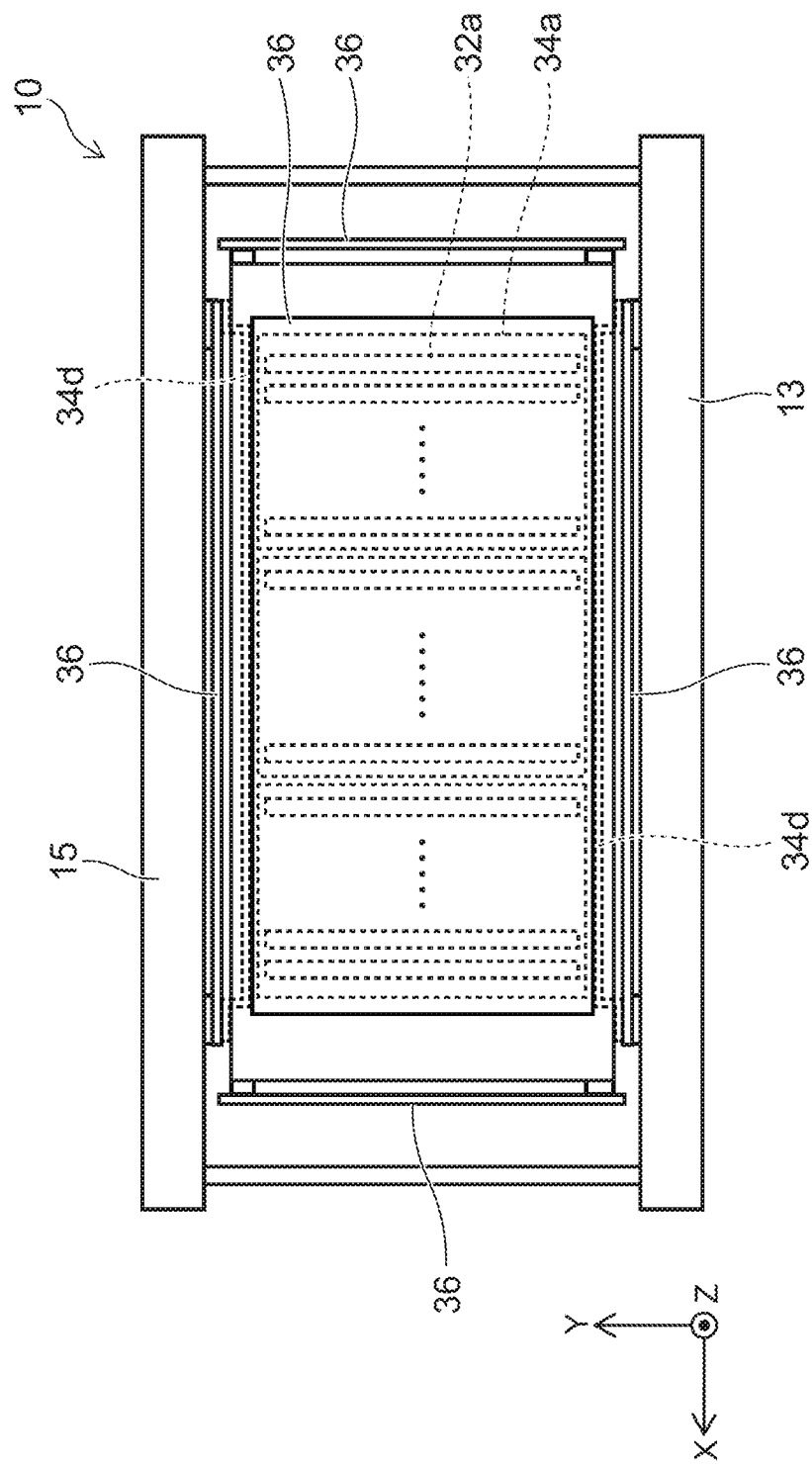
FIG. 6 is an A-A line cross sectional view in FIG. 5.

As shown in FIG. 1, FIG. 5, and FIG. 6, the processing part 30 includes a frame 31, a heating part 32, a workpiece supporter 33, a heat equalizing part 34, a heat equalizing plate supporter 35, and a cover 36.

The processing part 30 includes the processing room 30a and the processing room 30b. The processing room 30b is provided above the processing room 30a. Although the case where two processing rooms are provided is illustrated, the invention is not limited to this. It is also possible to provide only one processing room. Further, three or more processing rooms can be provided.

In the embodiment, as an example, the case where two processing rooms are provided is illustrated, but the case where one processing room and three or more processing rooms are provided can be similarly considered.

The frame 31 has a framed structure made of a long and thin plate or a shaped steel. The appearance shape of the frame 31 can be the same as the appearance shape of the chamber 10. The appearance shape of the frame 31 can be, for example, a rectangular parallelepiped.

A plurality of heating parts 32 are provided. The heating part 32 can be provided below the processing rooms 30a and 30b and above the processing rooms 30a and 30b. The heating part 32 provided below the processing rooms 30a and 30b is a lower heating part. The heating part 32 provided above the processing rooms 30a and 30b is an upper heating part. The lower heating part is opposed to the upper heating part. Note that in the case where a plurality of processing rooms are provided so as to be overlapped in the vertical direction, the upper heating part provided in the lower processing room can also serve as the lower heating part provided in the upper processing room.

For example, the lower surface (back surface) of the workpiece 100 placed in the processing room 30a is heated by the heating part 32 provided in the lower portion of the processing room 30a. The upper surface of the workpiece 100 placed in the processing room 30a is heated by the heating part 32 that is shared by the processing room 30a and the processing room 30b.

The lower surface (back surface) of the workpiece 100 placed in the processing room 30b is heated by the heating part 32 which is also used by the processing room 30a and the processing room 30b. The upper surface of the workpiece 100 placed in the processing room 30b is heated by the heating part 32 provided above the processing room 30b.

Therefore, the number of the heating parts 32 can be reduced, so that power consumption, manufacturing cost, and space can be reduced.

Each of the plurality of heating parts 32 has at least one heater 32a and a pair of holders 32b. In the following, a case where a plurality of heaters 32a are provided will be described. The pair of holders 32b are provided so as to extend in the longitudinal direction (the X direction in FIG. 1) of the processing rooms 30a and 30b.

The heater 32a has a rod shape and is provided to extend between the pair of holders 32b in the Y direction.

The plurality of heaters 32a can be arranged side by side in the direction in which the holder 32b extends. For example, the plurality of heaters 32a can be provided side by side in the longitudinal direction (X direction in FIG. 1) of the processing rooms 30a and 30b. The heater 32a is arranged such that its longitudinal direction is parallel to the direction (Y direction in FIG. 1) extending toward the opening of the chamber 10. Thereby, the plurality of heaters 32a can be easily extracted from the opening of the chamber 10 and taken out, so that the maintainability of the heater 32a is improved.

The plurality of heaters 32a are preferably provided at equal intervals. The heater 32a can be, for example, a sheath heater, a far-infrared heater, a far-infrared lamp, a ceramic heater, a cartridge heater, or the like. Further, various heaters can be covered with a quartz cover. In the specification, various types of heaters covered with a quartz cover are also referred to as "rod-shaped heaters".

In the case where wiring extends from near the ends of the plurality of heaters 32a, such as a cartridge heater, a wall separating the processing room from the space for maintenance can be provided near the ends of the plurality of heaters 32a in the chamber 10.

However, the heater 32a is not limited to the illustrated one. The heater 32a may be any as long as it can heat the workpiece 100 in an atmosphere reduced in pressure from the atmospheric pressure. That is, the heater 32a only needs to use thermal energy by radiation.

The specifications, numbers, intervals, etc. of the plurality of heaters 32a in the upper heating part and the lower heating part can be appropriately determined according to the composition of the solution to be heated (heating temperature of the solution), the size of the workpiece 100, and the like. The specifications, number, intervals, and the like of the plurality of heaters 32a can be appropriately determined by performing simulations, experiments, and the like. Further, a cross-sectional shape of the term "presenting a rod shape" is not limited, and includes a columnar shape, a prismatic shape, and the like.

As described above, the workpiece 100 is heated by the upper heating part and the lower heating part. In other words, the workpiece 100 is heated by a member that partitions both sides of the workpiece 100 in a space partitioned by the upper heating part and the lower heating part. Here, the vapor including the sublimate generated when the solution is heated tends to adhere to a location where the temperature is lower than the temperature of the workpiece 100 to be heated. However, since the members that partition both sides of the workpiece 100 are heated, the sublimed organic matter is discharged out of the chamber 10 by the downflow airflow described above without adhering to the members on both sides of the workpiece 100. As a result, it is possible to suppress the sublimate from re-adhering to the workpiece 100. Further, by heating from both sides of the workpiece 100, high temperature heating becomes possible.

That is, the organic film forming apparatus 1 according to the embodiment has a dual structure including the chamber 10 and the processing part 30 (processing rooms 30a and 30b) surrounded by the cover 36, and the processing part 30 includes the upper heating part and the lower heating part. Thereby, the workpiece 100 is heated from both sides. Accordingly, the substrate coated with the solution including the organic material and the solvent can be heated with low heat loss and high heat storage efficiency, and the organic film can be formed without the sublimate re-adhering.

The pair of holders 32b are provided to face each other in a direction orthogonal to the direction in which the plurality of heaters 32a are arranged. One holder 32b is fixed to the end face of the frame 31 on the side of the door 13. The other holder 32b is fixed to the end face of the frame 31 on the side opposite to the door 13 side. The pair of holders 32b can be fixed to the frame 31 using a fastening member such as a screw, for example. The pair of holders 32b holds a non-heat generating part near the end of the heater 32a. The pair of holders 32b can be formed from, for example, a long metal plate or a shaped steel. The material of the pair of holders 32b is not particularly limited, but is preferably a material having heat resistance and corrosion resistance. The material of the pair of holders 32b can be, for example, stainless steel.

The workpiece supporter 33 supports the workpiece 100 between the upper heating part and the lower heating part. A plurality of workpiece supporters 33 can be provided. The plurality of workpiece supporters 33 are provided below the processing room 30a and below the processing room 30b. The plurality of workpiece supporters 33 can be rod-shaped bodies.

One end (upper end in FIG. 1) of the plurality of workpiece supporters 33 contacts the lower surface (back surface) of the workpiece 100. Therefore, it is preferable that one end of each of the plurality of workpiece supporters 33 has a hemispherical shape. If the one end of each of the plurality of workpiece supporters 33 has a hemispherical shape, it is possible to prevent the lower surface of the workpiece 100 from being damaged. Further, since the contact area between the lower surface of the workpiece 100 and the plurality of workpiece supporters 33 can be reduced, heat transferred from the workpiece 100 to the plurality of workpiece supporters 33 can be reduced.

As described above, the workpiece 100 is heated by the thermal energy of radiation in the atmosphere whose pressure is lower than the atmospheric pressure. Therefore, the plurality of workpiece supporters 33 support the workpiece 100 so that the distance from the upper heating part to the upper surface of the workpiece 100 and the distance from the lower heating part to the lower surface of the workpiece 100 are such that the workpiece 100 can be heated.

Note that this distance is the distance at which thermal energy reaches the workpiece 100 from the heating part 32 by radiation.

The other ends (lower ends in FIG. 1) of the plurality of workpiece supporters 33 can be fixed to a plurality of rod-shaped members or plate-shaped members bridged between the pair of frames 31 on both sides of the processing part 30. In this case, if the plurality of workpiece support portions 33 are detachably provided, the work such as maintenance becomes easy. For example, a male screw can be provided on the other end of the workpiece supporting portion 33, and a female screw can be provided on the frame 31 or the like.

Further, for example, the plurality of workpiece supporters 33 may be placed without being fixed to the plurality of rod-shaped members or plate-shaped members that are bridged between the frames 31 on both sides of the processing part 30. For example, a plurality of holes are formed in the rod-shaped member or the plate-shaped member, and the plurality of workpiece supporters 33 can be held in the rod-shaped member or the plate-shaped member by inserting the plurality of workpiece supporters 33 into the holes. The diameter of the hole can be set to be acceptable even if the workpiece supporting portions 33 are thermally expanded. In this case, it is preferable that the diameter of the hole be such that the air between the workpiece supporting portion 33 and the inner wall of the hole can escape even if the air expands due to heat. By doing so, it is possible to prevent the workpiece supporting portion 33 from being pushed out even if the air in the hole is thermally expanded.

The number, arrangement, interval, etc. of the plurality of workpiece supporters 33 can be appropriately changed according to the size, rigidity (deflection), etc. of the workpiece 100. The number, arrangement, intervals, etc. of the plurality of workpiece supporters 33 can be appropriately determined by performing simulations or experiments.

The material for the plurality of workpiece supporters 33 are not particularly limited, but a material having heat resistance and corrosion resistance is preferable. The material of the plurality of workpiece supporters 33 can be, for example, stainless steel.

In addition, at least the ends of the plurality of workpiece supporters 33 that are in contact with the workpiece 100 can be formed of a material having a low thermal conductivity. In this case, the material having a low thermal conductivity can be ceramic, for example. In particular, among the ceramics, it is preferable to use a material having a thermal conductivity of 32W/(m·k) or less at 20° C. The ceramic can be, for example, alumina ($Al_2O_3$), silicon nitride ($Si_3N_4$), zirconia ($ZrO_2$), or the like.

The heat equalizing part 34 has a plurality of upper heat equalizing plates 34a, a plurality of lower heat equalizing plates 34b, a plurality of side heat equalizing plates 34c, and a plurality of side heat equalizing plates 34d. The plurality of upper heat equalizing plates 34a, the plurality of lower heat equalizing plates 34b, the plurality of side heat equalizing plates 34c, and the plurality of side heat equalizing plates 34d have a plate shape.

The plurality of upper heat equalizing plates 34a are provided on the lower heating part side (workpiece 100 side) of the upper heating part. The plurality of upper heat equalizing plates 34a are provided separately from the plurality of heaters 32a. That is, gaps are provided between the upper surfaces of the plurality of upper heat equalizing plates 34a and the lower surfaces of the plurality of heaters 32a. The plurality of upper heat equalizing plates 34a are arranged side by side in the direction in which the plurality of heaters 32a are arranged (the X direction in FIG. 1).

The plurality of lower heat equalizing plates 34b are provided on the upper heating part side (workpiece 100 side) of the lower heating part. The plurality of lower heat equalizing plates 34b are provided separately from the plurality of heaters 32a. That is, gaps are provided between the lower surfaces of the lower heat equalizing plates 34b and the upper surfaces of the heaters 32a. The plurality of lower heat equalizing plates 34b are arranged side by side in the direction in which the plurality of heaters 32a are arranged (X direction in FIG. 1).

Figure 8:
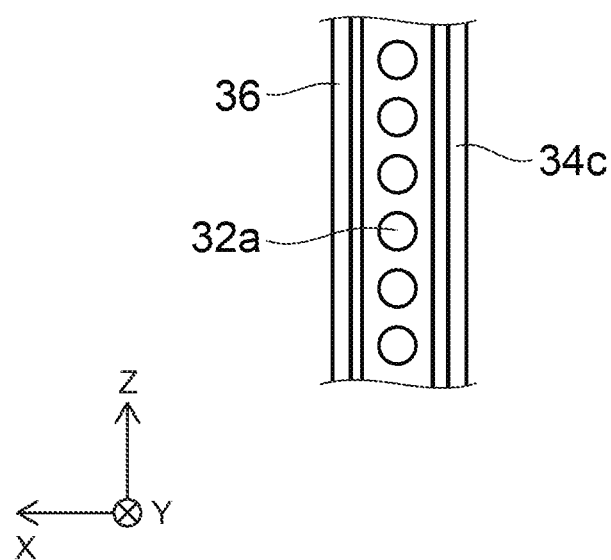
FIG. 8 is a schematic view for illustrating a heater separately provided from the side heat equalizing plate and a cover, and an enlarged view of a portion surrounded by the broken line P in FIG. 5.

The side heat equalizing plates 34c are provided on both sides (X direction in FIG. 1) of the processing rooms 30a and 30b in the direction in which the plurality of heaters 32a are arranged. The side heat equalizing plate 34c can be provided inside the cover 36. Further, at least one heater 32a that is provided separately from the side heat equalizing plate 34c and the cover 36 may be provided between the side heat equalizing plate 34c and the cover 36 (see FIG. 8).

Figure 7:
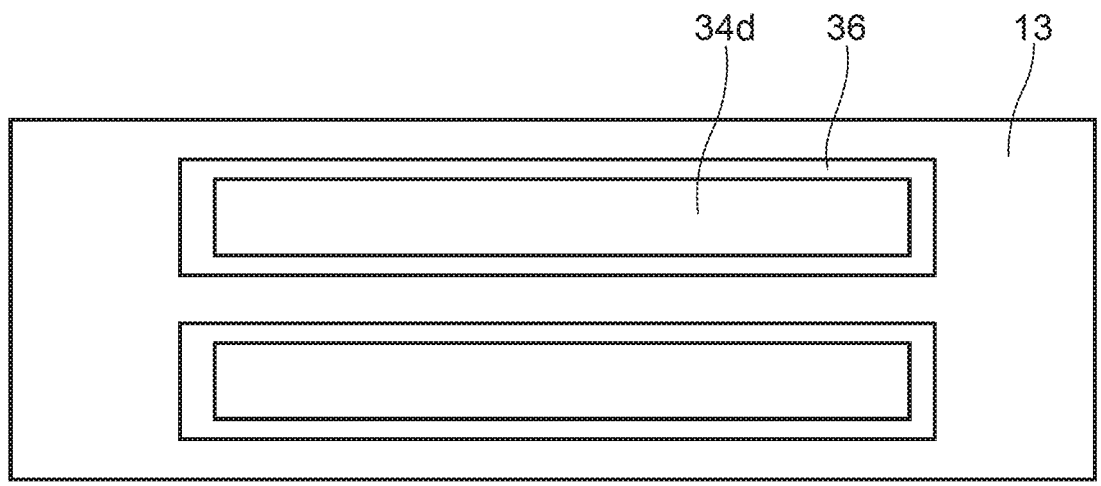
FIG. 7 is a schematic view for illustrating the side heat equalizing plate attached to a door as viewed from inside the chamber.

The side heat equalizing plates 34d are provided on both sides (Y direction in FIG. 1) of the processing room in the direction orthogonal to the direction in which the plurality of heaters 32a are arranged. As shown in FIG. 7, the side heat equalizing plate 34d is provided on the door 13 and the lid 15, and when the door 13 and the lid 15 are closed, the opening of the chamber 10 (each processing rooms 30a, 30b) is covered by the side heat equalizing plate 34d.

Thus, the processing rooms 30a and 30b are surrounded in all directions by the plurality of upper heat equalizing plates 34a, the plurality of lower heat equalizing plates 34b, the plurality of side heat equalizing plates 34c, and the plurality of side heat equalizing plates 34d. Further, the cover 36 surrounds these outer sides.

As described above, the plurality of heaters 32a have a rod shape and are arranged side by side with a predetermined interval. When the heater 32a is rod-shaped, heat is radially radiated from the central axis of the heater 32a. In this case, the shorter the distance between the central axis of the heater 32a and the heated portion, the higher the temperature of the heated portion. Therefore, when the workpiece 100 is held so as to face the plurality of heaters 32a, the region of the workpiece 100 located directly above or below the heaters 32a has a higher temperature than the region of the workpiece 100 located directly above or below the space between the plurality of heaters 32a. That is, when the workpiece 100 is directly heated by using the plurality of rod-shaped heaters 32a, an uneven temperature distribution is generated in the heated workpiece 100.

If the workpiece 100 has an uneven temperature distribution, the quality of the formed organic film may deteriorate. For example, bubbles may be generated in a portion where the temperature is high, or the composition of the organic film may be changed in the portion where the temperature is high.

Therefore, the organic film forming apparatus 1 according to the embodiment is provided with the plurality of upper heat equalizing plates 34a and the plurality of lower heat equalizing plates 34b described above. The heat radiated from the plurality of heaters 32a is incident on the plurality of upper heat equalizing plates 34a and the plurality of lower heat equalizing plates 34b, and is radiated toward the workpiece 100 while propagating in the inside in the plane direction. Therefore, it is possible to suppress the occurrence of non-uniform temperature distribution in the workpiece 100, and it is possible to improve the quality of the formed organic film. That is, according to the organic film forming apparatus 1 according to the embodiment, the substrate coated with the solution including the organic material and the solvent can be uniformly heated to uniformly form the organic film in the substrate surface.

In this case, if the distance between the surface of the heater 32a and the upper heat equalizing plate 34a immediately below and the distance between the surface of the heater 32a and the lower soaking plate 34b immediately above are too short, a non-uniform temperature distribution may occur in the upper heat equalizing plate 34a and the lower heat equalizing plate 34b, and thus a non-uniform temperature distribution may occur in the workpiece 100. Further, if these distances are made too long, the temperature rise of the workpiece 100 may be delayed. According to the knowledge obtained by the inventors, these distances are preferably not less than 20 mm and not more than 100 mm. Further, if the distance between the surface of the heater 32a and the upper heat equalizing plate 34a immediately below and the distance between the surface of the heater 32a and the lower heat equalizing plate 34b immediately above are the same, the heat radiated from the upper heating part and the lower heating part to the workpiece 100 can be made uniform.

The materials of the plurality of upper heat equalizing plates 34a and the plurality of lower heat equalizing plates 34b are preferably materials having high thermal conductivity. The plurality of upper heat equalizing plates 34a and the plurality of lower heat equalizing plates 34b can include, for example, at least one of aluminum, copper, and stainless steel.

Here, since the workpiece 100 is heated in an atmosphere depressurized below atmospheric pressure, it is possible to suppress the plurality of upper heat equalizing plates 34a and the plurality of lower heat equalizing plates 34b from oxidizing during heating of the workpiece 100. However, in order to unload the workpiece 100 on which the organic film is formed, it is necessary to lower the temperature of the workpiece 100 to about room temperature. In this case, in order to shorten the cooling time, for example, the cooling gas may be introduced into the chamber 10 from the cooling gas supplier not shown via the exhaust port 17 or the like. Nitrogen gas may be used as the cooling gas, but a mixed gas of nitrogen gas and air may be used in order to reduce the manufacturing cost.

Therefore, when the workpiece 100 is cooled, oxygen in the cooling gas may react with the materials of the plurality of upper heat equalizing plates 34a and the plurality of lower heat equalizing plates 34b.

Therefore, when the plurality of upper heat equalizing plates 34a and the plurality of lower heat equalizing plates 34b include copper, aluminum, etc., it is preferable to provide a layer including a material that is difficult to oxidize on the surface. For example, when the plurality of upper heat equalizing plates 34a and the plurality of lower heat equalizing plates 34b include copper, it is preferable to provide a layer including nickel on the surface. For example, the surfaces of the plurality of upper heat equalizing plates 34a and the plurality of lower heat equalizing plates 34b including copper can be nickel-plated. When the plurality of upper heat equalizing plates 34a and the plurality of lower heat equalizing plates 34b include aluminum, it is preferable to provide a layer including aluminum oxide on the surface. For example, the surfaces of the plurality of upper heat equalizing plates 34a and the plurality of lower heat equalizing plates 34b including aluminum can be anodized.

When the temperatures of the plurality of upper heat equalizing plates 34a and the plurality of lower heat equalizing plates 34b are 300° C. or less during heating, the plurality of upper heat equalizing plates 34a and the plurality of lower heat equalizing plates 34b including aluminum can be used.

When the temperature of the plurality of upper heat equalizing plates 34a and the plurality of lower heat equalizing plates 34b is 500° C. or higher during heating, it is preferable that the plurality of upper heat equalizing plates 34a and the plurality of lower heat equalizing plates 34b including stainless steel are included, alternatively, it is preferable that the plurality of upper heat equalizing plates 34a and the plurality of lower heat equalizing plates 34b have a layer including copper and including a layer including nickel on the surface are included. In this case, if a plurality of upper heat equalizing plates 34a and a plurality of lower heat equalizing plates 34b including stainless steel are used, versatility and maintainability can be improved.

Further, a part of the heat radiated from the plurality of upper heat equalizing plates 34a and the plurality of lower heat equalizing plates 34b is directed to the side of the processing room. Therefore, the side heat equalizing plates 34c and 34d described above are provided on the side portions of the processing room. The heat that has entered the side heat equalizing plates 34c and 34d propagates through the side heat equalizing plates 34c and 34d in the surface direction, and a part of the heat is radiated toward the workpiece 100. Therefore, the heating efficiency of the workpiece 100 can be improved.

Further, as described above, if at least one heater 32a is provided outside the side heat equalizing plate 34c, the heating efficiency of the workpiece 100 can be further improved. Further, the sublimate generated when the organic film is heated tends to adhere to a place lower than the ambient temperature. By heating the side heat equalizing plate 34c also, it is possible to suppress the sublimated organic matter from adhering to the side heat equalizing plate 34c.

Here, if a non-uniform temperature distribution different from that of the upper heat equalizing plate 34a and the lower heat equalizing plate 34b occurs in the side heat equalizing plates 34c and 34d, the workpiece 100 may have a non-uniform temperature distribution. Therefore, it is preferable that the material of the side heat equalizing plates 34c and 34d is the same as the material of the upper heat equalizing plate 34a and the lower heat equalizing plate 34b described above.

As described above, the temperatures of the plurality of upper heat equalizing plates 34a and the plurality of lower heat equalizng plates 34b may be 500° C. or higher. Therefore, the amount of expansion of the upper heat equalizing plate 34a and the lower heat equalizing plate 34b may increase, or warpage due to thermal deformation may occur. Therefore, it is preferable to provide a gap between the plurality of upper heat equalizing plates 34a. It is preferable to provide a gap between the plurality of lower soaking plates 34b.

These gaps can be appropriately determined depending on the heating temperature, the size of the upper heat equalizing plate 34a in the direction in which the plurality of upper heat equalizing plates 34a are arranged, the size of the lower heat equalizing plate 34b in the direction in which the plurality of lower heat equalizing plates 34b are arranged, and the materials of the upper heat equalizing plate 34a and the lower heat equalizing plate 34b. For example, at a predetermined maximum heating temperature, a gap of about 1 mm to 2 mm can be formed between each of the plurality of upper heat equalizing plates 34a and each of the plurality of lower heat equalizing plates 34b. With this configuration, it is possible to suppress the plurality of upper heat equalizing plates 34a from interfering with each other and the plurality of lower heat equalizing plates 34b from interfering with each other during heating.

The plurality of upper heat equalizing plates 34a and the plurality of lower heat equalizing plates 34b have been described as being arranged side by side in the direction in which the plurality of heaters 32a are arranged. However, at least one may be a single plate member. In this case, at least one of the upper heat equalizing plate 34a and the lower heat equalizing plate 34b is held by the pair of heat equalizing plate support portions 35 closest to both ends of the frame 31. The details of the soaking plate support portion 35 will be described later.

Even when the upper heat equalizing plate 34a and the lower heat equalizing plate 34b are formed as a single plate-shaped member, the heat radiated from the plurality of heaters 32a is incident on the upper heat equalizing plate 34a and the lower heat equalizing plate 34b. Then, they are radiated toward the workpiece 100 while propagating in the inside in the plane direction. Therefore, it is possible to suppress the occurrence of non-uniform temperature distribution in the workpiece 100, and it is possible to improve the quality of the formed organic film. That is, according to the organic film forming apparatus 1 according to the embodiment, the substrate coated with the solution including the organic material and the solvent can be uniformly heated to uniformly form the organic film in the substrate surface.

Figure 2A:
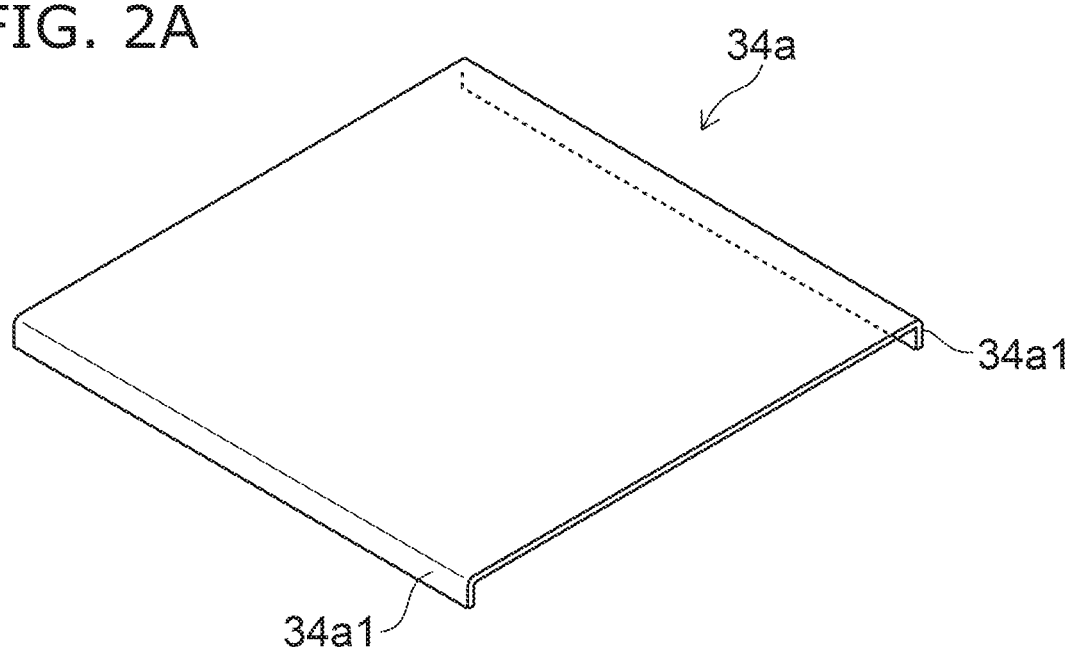
FIG. 2A is a schematic perspective view for illustrating the aspect of an upper heat equalizing plate.

FIG. 2A is a schematic perspective view for illustrating the aspect of the upper heat equalizing plate 34a.

As shown in FIG. 2A, the upper heat equalizing plate 34a has a plate shape. Further, in the direction in which the plurality of upper heat equalizing plates 34a are arranged, the bent portions 34a1 are provided at both ends of the upper heat equalizing plate 34a. If the bent portion 34a1 is provided, the rigidity of the upper heat equalizing plate 34a can be improved. Therefore, when the upper heat equalizing plate 34a is heated, it is possible to suppress the upper heat equalizing plate 34a from warping.

Figure 2B:
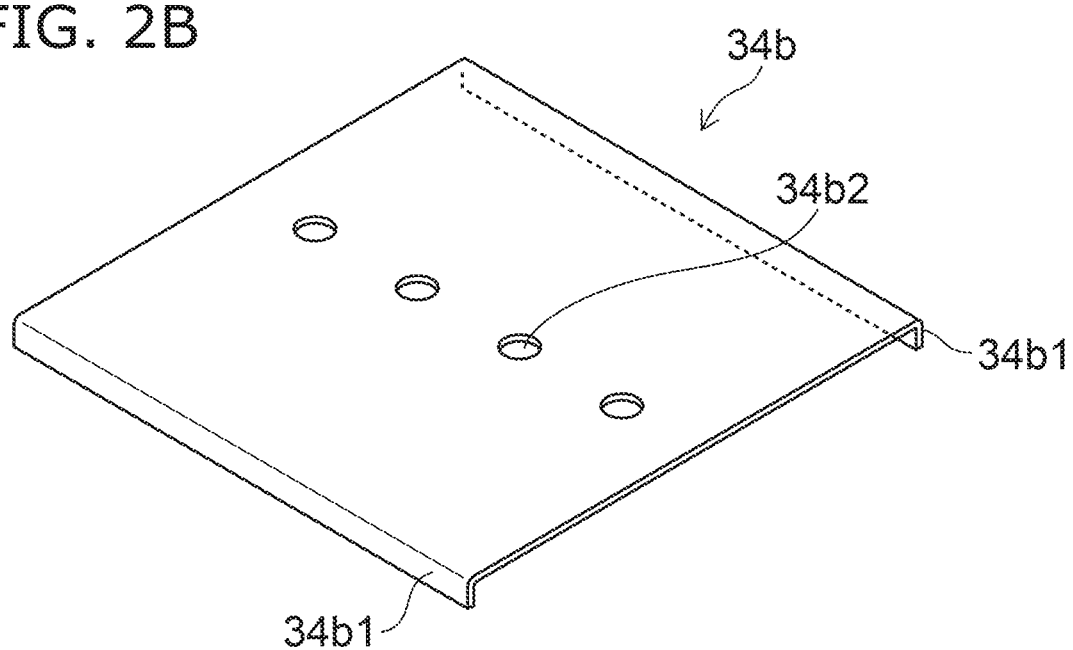
FIG. 2B is a schematic perspective view for illustrating the aspect of a lower heat equalizing plate.

FIG. 2B is a schematic perspective view for illustrating the aspect of the lower heat equalizing plate 34b.

As shown in FIG. 2B, the lower heat equalizing plate 34b has a plate shape. Further, bent portions 34b1 are provided at both ends of the lower heat equalizing plate 34b in the direction in which the plurality of lower heat equalizing plates 34b are arranged. If the bent portion 34b1 is provided, the rigidity of the lower heat equalizing plate 34b can be improved. Therefore, when the lower heat equalizing plate 34b is heated, it is possible to suppress the lower heat equalizing plate 34b from warping.

Further, the lower heat equalizing plate 34b can be provided with a hole 34b2 into which the workpiece supporter 33 is inserted. The size of the hole 34b2 is larger than the cross-sectional dimension of the workpiece supporter 33.

The side heat equalizing plates 34c, 34d may be flat plates.

Figure 3A:
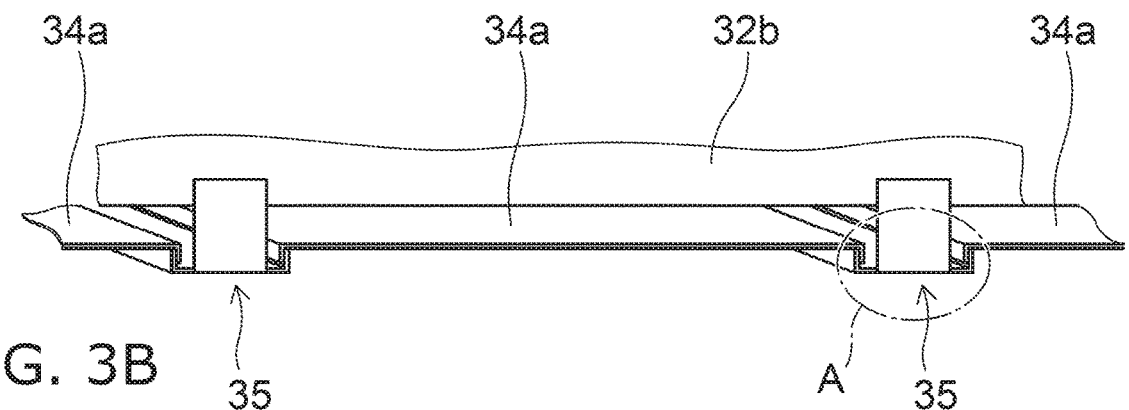
FIG. 3A is a schematic perspective view for illustrating a heat equalizing plate supporter.

FIG. 3A is a schematic perspective view for illustrating the heat equalizing plate supporter 35.

Figure 3B:
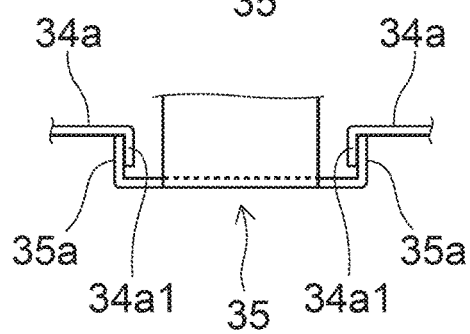
FIG. 3B is a schematic enlarged view of a portion A in FIG. 3A.

FIG. 3B is a schematic enlarged view of a portion A in FIG. 3A.

As described above, when the workpiece 100 is heated, the temperatures of the upper heat equalizing plate 34a and the lower heat equalizing plate 34b rise, and the dimensions of the upper heat equalizing plate 34a and the lower heat equalizing plate 34b expand. Therefore, when the upper heat equalizing plate 34a and the lower heat equalizing plate 34b are fixed using a fastening member such as a screw, the upper heat equalizing plate 34a and the lower heat equalizing plate 34b are deformed by thermal expansion. When the upper heat equalizing plate 34a and the lower heat equalizing plate 34b are deformed, the distance between the upper heat equalizing plate 34a and the workpiece 100 and the distance between the lower heat equalizing plate 34b and the workpiece 100 locally change. The workpiece 100 may have a non-uniform temperature distribution.

Therefore, the organic film forming apparatus 1 according to the embodiment is provided with a plurality of heat equalizing plate supporters 35.

In this case, it is possible to provide an upper heat equalizing plate supporter that detachably supports a plurality of upper heat equalizing plates 34a and a lower heat equalizing plate supporter that detachably supports a plurality of lower heat equalizing plates 34b.

As shown in FIG. 3A, the plurality of heat equalizing plate supporters 35 (upper heat equalizing plate supporters) are arranged side by side in the direction in which the plurality of upper heat equalizng plate 34a are arranged. The heat equalizing plate supporter 35 can be provided immediately below between the upper heat equalizing plates 34a in the direction in which the plurality of upper heat equalizing plates 34a are arranged.

The plurality of heat equalizing plate supporters 35 can be fixed to the pair of holders 32b using fastening members such as screws.

As shown in FIGS. 3A and 3B, the heat equalizing plate supporter 35 supports the surface (lower surface) of the upper heat equalizing plate 34a on the side where the bent portion 34a1 projects. The heat equalizing plate supporter 35 supports the vicinity of the upper heat equalizing plate 34a where the bent portion 34a1 is provided. In this case, one heat equalizing plate supporter 35 supports the vicinity where one bent portion 34a1 is provided, and the other heat equalizing plate supporter 35 supports the vicinity where the other bent portion 34a1 is provided. That is, one upper heat equalizing plate 34a is supported by the pair of heat equalizing plate supporters 35.

As shown in FIG. 3B, in the direction in which the plurality of upper heat equalizing plates 34a are arranged, bent portions 35a protruding toward the upper heat equalizing plate 34a are provided at both ends of the heat equalizing plate supporter 35.

When the tip of the bent portion 35a contacts the lower surface of the upper heat equalizing plate 34a, the tip of the bent portion 34a1 of the upper heat equalizing plate 34a can be prevented from contacting the heat equalizing plate supporter 35. When the tip of the bent portion 34a1 of the upper heat equalizing plate 34a contacts the heat equalizing plate supporter 35, the tip of the bent portion 35a can be prevented from contacting the lower surface of the upper heat equalizing plate 34a.

In this way, the contact points between the heat equalizing plate supporter 35 and the upper heat equalizing plate 34a are reduced as much as possible, so that it is possible to reduce heat transfer due to heat conduction from the upper portion of the heat equalizing plate supporter 35 which is attached to the holder 32b supporting the plurality of heaters 32a to the heat equalizing plate 34a. Therefore, local heat transfer from the contact point between the heat equalizing plate supporter 35 and the upper heat equalizing plate 34a can be suppressed, and the upper heat equalizing plate 34a has a non-uniform heat distribution, resulting in to suppress uneven heating.

The lower surface of the upper heat equalizing plate 34a may be supported by a plurality of pins or the like instead of the bent portion 35a.

The above is the case of the heat equalizing plate supporter 35 that supports the upper heat equalizing plate 34a, but the heat equalizing plate supporter 35 (lower het equalizing plate supporter) that supports the lower het equalizing plate 34b has the same configuration.

For example, the plurality of heat equalizing plate supporters 35 are arranged side by side in the direction in which the plurality of lower heat equalizing plates 34b are arranged. The heat equalizing plate supporter 35 can be provided immediately below between the lower heat equalizing plates 34b in the direction in which the plurality of lower heat equalizing plates 34b are arranged. The plurality of heat equalizing plate supporters 35 can be fixed to the pair of holders 32b by using fastening members such as screws.

The heat equalizing plate supporter 35 supports the surface (lower surface) of the lower heat equalizing plate 34b on the side where the bent portion 34b1 projects. The heat equalizing plate supporter 35 supports the vicinity of the lower heat equalizing plate 34b where the bent portion 34b1 is provided. In this case, one heat equalizing plate supporter 35 supports the vicinity where one bent portion 34b1 is provided, and the other heat equalizing plate supporter 35 supports the vicinity where the other bent portion 34b1 is provided. That is, one lower heat equalizing plate 34b is supported by the pair of heat equalizing plate supporters 35 that are adjacent to each other in the longitudinal direction of the processing rooms 30a and 30b (X direction in FIG. 1).

In the direction in which the plurality of lower heat equalizing plates 34b are arranged, bent portions 35a that project toward the lower heat equalizing plate 34b are provided at both ends of the heat equalizing plate supporter 35. When the tip of the bent portion 35a contacts the lower surface of the lower heat equalizing plate 34b, the tip of the bent portion 34b1 of the lower heat equalizing plate 34b can be prevented from contacting the heat equalizing plate supporter 35. When the tip of the bent portion 34b1 of the lower heat equalizing plate 34b contacts the heat equalizing plate supporter 35, the tip of the bent portion 35a can be prevented from contacting the lower surface of the lower heat equalizing plate 34b.

The lower surface of the lower heat equalizing plate 34b may be supported by a plurality of pins or the like instead of the bent portion 35a.

The heat equalizing plate supporter 35 and the upper heat equalizing plate 34a are not fixed, and the heat equalizing plate supporter 35 and the lower heat equalizing plate 34b are not fixed, and the heat equalizing plate supporter 35 only supports the upper heat equalizing plate 34a and the lower heat equalizing plate 34b. Therefore, it is possible to suppress deformation of the upper heat equalizing plate 34a and the lower heat equalizing plate 34b due to thermal expansion. Therefore, it is possible to suppress the occurrence of non-uniform temperature distribution in the workpiece 100.

Further, the pair of heat equalizing plate supporters 35 support the vicinity of the one upper heat equalizing plate 34a where the bent portion 34a1 is provided. Therefore, it is possible to suppress the position of the upper heat equalizing plate 34a from being displaced more than necessary due to the interference between the bent portion 34a1 and the bent portion 35a in the direction in which the plurality of upper heat equalizing plates 34a are arranged.

Further, the pair of heat equalizing plate supporters 35 support the vicinity of the one lower heat equalizing plate 34b where the bent portion 34b1 is provided. Therefore, it is possible to suppress the position of the lower heat equalizing plate 34b from being displaced more than necessary due to the interference between the bent portion 34b1 and the bent portion 35a in the direction in which the plurality of lower heat equalizing plates 34b are arranged.

Further, since the upper heat equalizing plate 34a and the lower heat equalizing plate 34b are detachably provided, the upper heat equalizing plate 34a and the lower heat equalizing plate 34b are able to be easily removed from the heat equalizing plate supporter 35 at the time of maintenance.

Here, when the solution including the organic material and the solvent is heated, the vapor including the organic material may adhere to the upper heat equalizing plate 34a and the lower heat equalizing plate 34b. The deposits attached to the upper heat equalizing plate 34a and the lower heat equalizing plate 34b cause particles. If the upper heat equalizing plate 34a and the lower heat equalizing plate 34b are detachably provided, during maintenance, the upper heat equalizing plate 34a and the lower heat equalizing plate 34b to which the adhered substances are attached can be easily replaced with the upper soaking plate 34a and the lower soaking plate 34b which are cleaned in advance. Therefore, the maintainability can be improved.

Further, the vertical position of the heat equalizing plate supporter 35 may be changed. For example, the fastening portion of the heat equalizing plate supporter 35 with the holder 32b may be formed into a long hole or the like so that the vertical position of the heat equalizing plate supporter 35 can be changed.

When the workpiece 100 is large, the influence of heat radiation conditions and the like becomes large, and a temperature difference may occur between the regions of the workpiece 100.

In this case, if the vertical position of the heat equalizing plate supporter 35 can be changed, for example, as shown in FIG. 1, the distance between the lower heat equalizing plate 34b and the workpiece 100 can be changed for each of the plurality of lower heat equalizing plates 34b. If the distance between the lower heat equalizing plate 34b and the workpiece 100 becomes shorter, the temperature in the corresponding region of the workpiece 100 can be raised.

Therefore, it is possible to suppress the temperature difference between the regions of the workpiece 100.

The case where the vertical positions of the plurality of lower heat equalizing plates 34b are changed has been illustrated, but the same can be applied to the case where the vertical positions of the plurality of upper heat equalizing plates 34a are changed.

Figure 4:
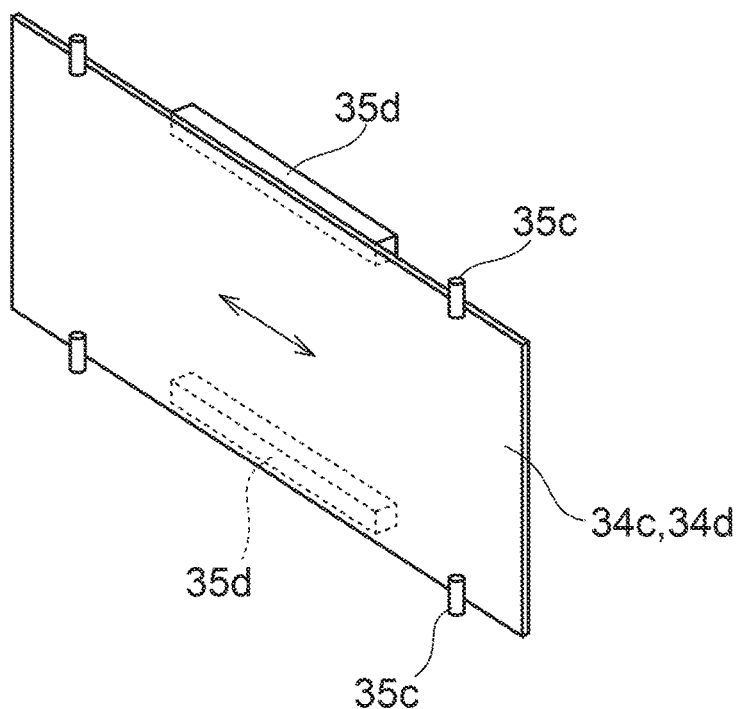
FIG. 4 is a schematic perspective view for illustrating supporting a side heat equalizing plate.

FIG. 4 is a schematic perspective view for illustrating the support of the side heat equalizing plates 34c and 34d.

As shown in FIG. 4, a plurality of supporters 35c are provided on one surface side of the side heat equalizing plates 34c and 34d. The supporters 35c and 35d that support the side heat equalizing plate 34c can be provided in the frame 31, for example. The plurality of supporters 35c can be, for example, cylindrical pins. The plurality of supporters 35c are provided near the vertical sides of the side heat equalizing plates 34c and 34d.

A plurality of supporters 35d are provided on the other surface side of the side heat equalizing plates 34c and 34d. The plurality of supporters 35d can be, for example, blocks having a rectangular parallelepiped shape. The plurality of supporters 35d are provided near the vertical sides of the side heat equalizing plates 34c and 34d.

In the thickness direction of the side heat equalizing plates 34c and 34d, the side heat equalizing plates 34c and 34d can be inserted into the gaps between the supporters 35c and 35d. That is, the supporters 35c and 35d detachably support the side heat equalizing plates 34c and 34d.

The side heat equalizing plates 34c and 34d and the support portions 35c and 35d are not fixed, and the supporters 35c and 35d only support the side heat equalizing plates 34c and 34d. It is possible to suppress deformation of the heat equalizing plates 34c and 34d due to thermal expansion. Further, since the side heat equalizing plates 34c and 34d are detachably provided, the side heat equalizing plates 34c and 34d can be easily removed from the supporters 35c and 35d at the time of maintenance.

Therefore, similar to the above-described upper heat equalizing plate 34a and lower heat equalizing plate 34b, during the maintenance, the side heat equalizing plates 34c and 34d to which the adhered substances are attached can be easily replaced with the side heat equalizing plates 34c, 34d that have been cleaned in advance. Therefore, the maintainability can be improved.

The supporters 35c and 35d that support the side heat equalizing plate 34c can be provided in the frame 31, for example, as described above. The supporters 35c and 35d that support the side heat equalizing plate 34d on the side opposite to the door 13 side can be provided in the frame 31, for example. The supporters 35c and 35d that support the side heat equalizing plate 34d on the door 13 side can be provided on the door 13, for example.

As shown in FIG. 5 and FIG. 6, the cover 36 has a flat plate shape and covers the top surface, the bottom surface, and the side surfaces of the frame 31. That is, the inside of the frame 31 is covered with the cover 36. However, the cover 36 on the door 13 side can be provided on the door 13, for example.

The cover 36 surrounds the processing rooms 30a and 30b, however gaps communicating a space between the inner wall of the chamber 10 and the cover 36 with the processing rooms 30a and 30b are provided at the boundary between the upper surface and the side surface of the frame 31, the boundary between the side surface and the bottom surface of the frame 31, and the vicinity of the door 13.

That is, the space inside the processing part 30 (processing room 30a) is a space communicating with the space inside the chamber 10.

Therefore, since the space between the inner wall of the chamber 10 and the cover 36 is connected to the processing chambers 30a and 30b, the pressure inside the processing chambers 30a and 30b is the space between the inner wall of the chamber 10 and the cover 36. The pressure can be the same. The cover 36 can be formed of, for example, stainless steel.

The cover 36 can also have a function of reflecting the heat incident from the heater 32a side to the processing rooms 30a and 30b side.

Therefore, if the cover 36 is provided, the heat escaping from the processing rooms 30a and 30b to the outside can be reduced, and thus the heating efficiency can be improved.

The controller 40 includes an arithmetic part such as a CPU (Central Processing Unit) and a memory part such as a memory.

The controller 40 controls the operation of each element provided in the organic film forming apparatus 1 based on a control program stored in the memory part.

As described above, the organic film forming apparatus 1 according to the embodiment has the double structure including the chamber 10 and the processing part 30 (processing rooms 30a and 30b) surrounded by the cover 36. By providing the processing part 30 with the upper heating part and the lower heating part, heating is performed from both sides of the workpiece 100. Furthermore, since the upper heat equalizing plate 34a and the lower heat equalizing plate 34b are provided separately from the heater 32a, the heat from the upper heating part and the lower heating part can be radiated to the workpiece 100 through the space between the upper heat equalizing plate 34a and the heater 32a or the space between the lower heat equalizing plate 34a and the heater 32a. Therefore, even if the plurality of heaters 32a are arranged side by side with a predetermined interval, the heat radiated from the heater 32a is leveled in the space and is transferred to the upper heat equalizing plate 34a and the lower heat equalizing plate 34b, and the heat can be evenly radiated to the workpiece 100. Further, since the processing rooms 30a and 30b are surrounded in all directions by the upper heat equalizing plate 34a, the lower heat equalizing plate 34b, and the side heat equalizing plate 34d, the outer circumference portion of the workpiece 100 from which heat is easily released can be heated similarly to the central portion, and the temperature distribution on the entire surface of the workpiece 100 can be made uniform.

With the above configuration, a substrate coated with a solution including an organic material and a solvent can be heated with low heat loss and high heat storage efficiency, and a uniform organic film can be formed without redeposition of sublimates.

The embodiments have been exemplified above. However, the invention is not limited to these descriptions.

For example, in the above-described embodiment, the cooling part 16 is provided on the outer wall of the chamber 10 in the organic film forming apparatus 1. However, if the temperature difference between the outer wall temperature of the chamber 10 and the outside air is small, the cooling part 16 may be appropriately omitted and the outer wall of the chamber 10 may be cooled by air cooling.

Further, for example, in the above-described embodiment, the cover 36 covers the upper surface and the bottom surface of the frame 31 in the organic film forming apparatus 1, however the invention is not limited to this, and instead of the cover 36, along with the cover 36, a heat equalizing plate 34e having the same function as that of the upper heat equalizing plate 34a, or the reflection plate that reflects the heat incident from the heater 32a side to the processing rooms 30a and 30b side may cover the top and bottom surfaces of the frame 31. In this case, the upper part of the heating part 32 in the uppermost stage or the lower part of the heating part 32 in the lowermost stage is covered with the heat equalizing plate or the reflection plate.

Further, for example, in the above-described embodiment, the cover 36 is covered with a single plate in the organic film forming apparatus 1, however the cover 36 may be divided into a plurality of parts to provide a gap between the divided covers 36.

In the above embodiments, design modification appropriately made by a person skilled in the art in regard to the embodiments is within the scope of the embodiments to the extent that the features of the embodiments are included.

For example, the shape, the dimension, the disposition or the like of the organic film forming apparatus 1 are not limited to the illustration and can be appropriately modified.

Each element included in each example described above can be combined to the extent possible, and these combinations are also encompassed within the scope of the invention as long as they include the features of the invention.

What is claimed is:

1. An organic film forming apparatus, comprising:
a chamber configured to maintain an atmosphere more reduced than an atmospheric pressure;
at least one processing room provided inside the chamber and being surrounded by a cover; and
an exhaust part configured to exhaust the inside the chamber,
the processing room including
an upper heating part including a plurality of first heaters provided to be arranged in a predetermined direction, the plurality of first heaters having a rod shape,
a lower heating part including a plurality of second heaters provided to be arranged in the predetermined direction, facing the upper heating part, and the plurality of second heaters having a rod shape,
an upper heat equalizing plate provided on the lower heating part side of the upper heating part, a gap being provided between an upper surface of the upper heat equalizing plate and the lower surfaces of the first heaters,
a lower heat equalizing plate provided on the upper heating part side of the lower heating part, a gap being provided between an lower surface of the lower heat equalizing plate and the upper surfaces of the second heaters,
a plurality of workpiece supporters configured to support a workpiece through a gap between the upper heat equalizing plate and the lower heat equalizing plate, the workpiece including a substrate and a solution including polyamic acid coated on an upper surface of the substrate, the workpiece supporters being rod-shaped bodies,
an upper heat equalizing plate supporter detachably supporting the upper heat equalizing plate, and
a lower heat equalizing plate supporter detachably supporting the lower heat equalizing plate,
wherein
the upper heat equalizing plate includes one pair of holders facing in a direction orthogonal to a direction along which the plurality of first heaters are arranged,
a plurality of the upper heat equalizing plate supporters are fixed to the pair of holders, the upper heat equalizing plate includes a bent portion,
the heat equalizing plate supporter includes a bent portion protruding toward the upper heat equalizing plate,
when a tip of the bent portion of the heat equalizing plate supporter contacts a lower surface of the upper heat equalizing plate, a tip of the bent portion of the upper heat equalizing plate does not contact the heat equalizing plate supporter, and
when the tip of the bent portion of the heat equalizing plate supporter does not contact the lower surface of the upper heat equalizing plate, the tip of the bent portion of the upper heat equalizing plate contacts the heat equalizing plate supporter,
the processing room having a space communicating with the chamber, the exhaust part reducing a pressure inside the chamber, and reducing a pressure of a space between an inner wall of the chamber and the cover.

2. The apparatus according to claim 1, wherein
the processing room is provided in a plurality to overlap in a vertical direction, and
the upper heating part provided in the processing room of the lower side serves as the lower heating part provided in the processing room of the upper side.

3. The apparatus according to claim 1, wherein
in the predetermined direction, a side heat equalizing plate is further provided in each of side parts of both sides of the processing room, and
the side heat equalizing plate is provided inside the cover.

4. The apparatus according to claim 3, wherein
the chamber has openings facing each other, in a direction orthogonal to the predetermined direction, a side heat equalizing plate is further provided on each of both sides of the processing room, and the side heat equalizing plate is provided inside a lid closing one of the openings and inside a door closing one other of the openings.

5. The apparatus according to claim 3, further comprising:
at least one third heater provided between the side heat equalizing plate and the cover to be separated from the side heat equalizing plate and the cover.

6. The apparatus according to claim 3, further comprising:
a supporter detachably supporting the side heat equalizing plate.

7. The apparatus according to claim 1, wherein
the upper heat equalizing plate and the lower heat equalizing plate include at least one of aluminum, copper, or stainless steel.

8. The apparatus according to claim 7, wherein
when the upper heat equalizing plate and the lower heat equalizing plate include the copper, a layer including nickel is provided on a surface.

9. The apparatus according to claim 1, wherein
a distance between a surface of the first heater and the upper heat equalizing plate is same as a distance between a surface of the second heater and the lower heat equalizing plate.

10. The apparatus according to claim 1, wherein
the cover has function of reflecting a heat incident from the upper heating part side or the lower heating part side to the processing room side.

11. An organic film forming apparatus comprising:
a chamber configured to maintain an atmosphere more reduced than an atmospheric pressure;
at least one processing room provided inside the chamber and being surrounded by a cover; and
an exhaust part configured to exhaust the inside the chamber,
the processing room including
   an upper heating part including a plurality of first heaters provided to be arranged in a predetermined direction, the plurality of first heaters having a rod shape,
   a lower heating part including a plurality of second heaters provided to be arranged in the predetermined direction, facing the upper heating part, and the plurality of second heaters having a rod shape,
   an upper heat equalizing plate provided on the lower heating part side of the upper heating part, a gap being provided between an upper surface of the upper heat equalizing plate and the lower surfaces of the first heaters,
   a lower heat equalizing plate provided on the upper heating part side of the lower heating part, a gap being provided between an lower surface of the lower heat equalizing plate and the upper surfaces of the second heaters,
   a side heat equalizing plate provided in each of side parts of both sides of the processing room in the predetermined direction,
   a side heat equalizing plate provided on each of both sides of the processing room in a direction orthogonal to the predetermined direction,
   a plurality of workpiece supporters configured to support a workpiece through a gap between the upper heat equalizing plate and the lower heat equalizing plate, the workpiece including a substrate and a solution including polyamic acid coated on an upper surface of the substrate, the workpiece supporters being rod-shaped bodies, and
   an upper heat equalizing plate supporter detachably supporting the upper heat equalizing plate and provided in the processing room,
wherein
the upper heating part includes a pair of holders facing in a direction orthogonal to a direction along which the plurality of first heaters are arranged,
a plurality of the upper heat equalizing plate supporters are fixed to the pair of holders,
the upper heat equalizing plate includes a bent portion,
the heat equalizing plate supporter includes a bent portion protruding toward the upper heat equalizing plate,
when a tip of the bent portion of the heat equalizing plate supporter contacts a lower surface of the upper heat equalizing plate, a tip of the bent portion of the upper heat equalizing plate does not contact the heat equalizing plate supporter,
when the tip of the bent portion of the heat equalizing plate supporter does not contact the lower surface of the upper heat equalizing plate, the tip of the bent portion of the upper heat equalizing plate contacts the heat equalizing plate supporter,
the workpiece supported by the workpiece supporters in the processing room being surrounded in all directions by the upper heat equalizing plate, the lower heat equalizing plate and the side heat equalizing plates.

12. The apparatus according to claim 11, wherein
a distance between a surface of the first heater and the upper heat equalizing plate is same as a distance between a surface of the second heater and the lower heat equalizing plate.

13. The apparatus according to claim 11, wherein
the cover has function of reflecting a heat incident from the upper heating part side or the lower heating part side to the processing room side.

* * * * *